(12) United States Patent
Dietrich et al.

(10) Patent No.: US 7,404,018 B2
(45) Date of Patent: Jul. 22, 2008

(54) READ LATENCY CONTROL CIRCUIT

(75) Inventors: Stefan Dietrich, Türkenfeld (DE);
Thomas Hein, München (DE); Patrick Heyne, München (DE); Peter Schroegmeier, München (DE)

(73) Assignee: Infineon Technologies AG, Munich (DE)

( * ) Notice: Subject to any disclaimer, the term of this patent is extended or adjusted under 35 U.S.C. 154(b) by 464 days.

(21) Appl. No.: 11/136,712

(22) Filed: May 25, 2005

(65) Prior Publication Data

US 2005/0270852 A1    Dec. 8, 2005

(30) Foreign Application Priority Data

May 27, 2004    (DE)    .................. 10 2004 025 900

(51) Int. Cl.
*G06F 3/00*    (2006.01)
*G06F 13/00*    (2006.01)

(52) U.S. Cl. .................. 710/52; 711/100; 711/104
(58) Field of Classification Search ................. None
See application file for complete search history.

(56) References Cited

U.S. PATENT DOCUMENTS 7,260,688 B1 *    8/2007    Baxter et al. .................. 711/147

2005/0050375 A1 *    3/2005    Novak et al. .................. 713/600

OTHER PUBLICATIONS

Ho Young Song et al. (2003) "A 1.2 Gb/s/pin Double Data Rate SDRAM with On-Die-Termination," IEEE International Solid-State Circuits Conference, Session 17, Paper 17.8, 10 pages.

* cited by examiner

*Primary Examiner*—Alan S. Chen
(74) *Attorney, Agent, or Firm*—Eschweiler & Associates LLC

(57) ABSTRACT

The invention provides a method for setting and controlling a read latency (L) by means of a FIFO-based read latency control circuit for a read access to a semiconductor memory, having the method steps of providing a common internal clock signal; generating an internal first clock signal and an internal second clock signal, which is different from the first clock signal, from the common clock signal; generating an output pointer for reading out the read data from the first clock signal; generating an input pointer for reading in the read data from the second clock signal; initializing the input and output pointers by allocating a defined, fixedly predetermined time offset between output pointer and input pointer. The invention furthermore provides a corresponding circuit arrangement for carrying out the method.

25 Claims, 7 Drawing Sheets

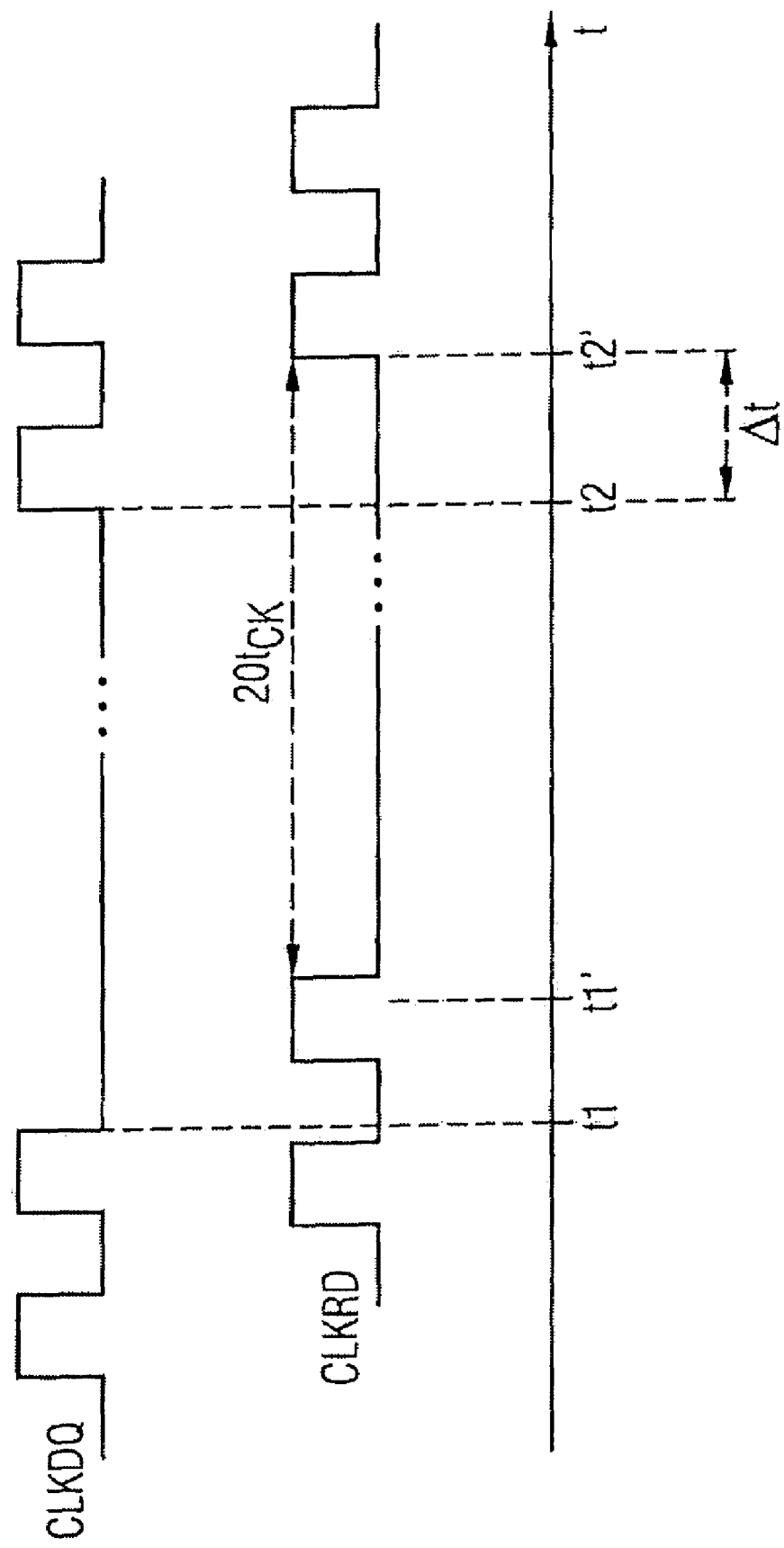

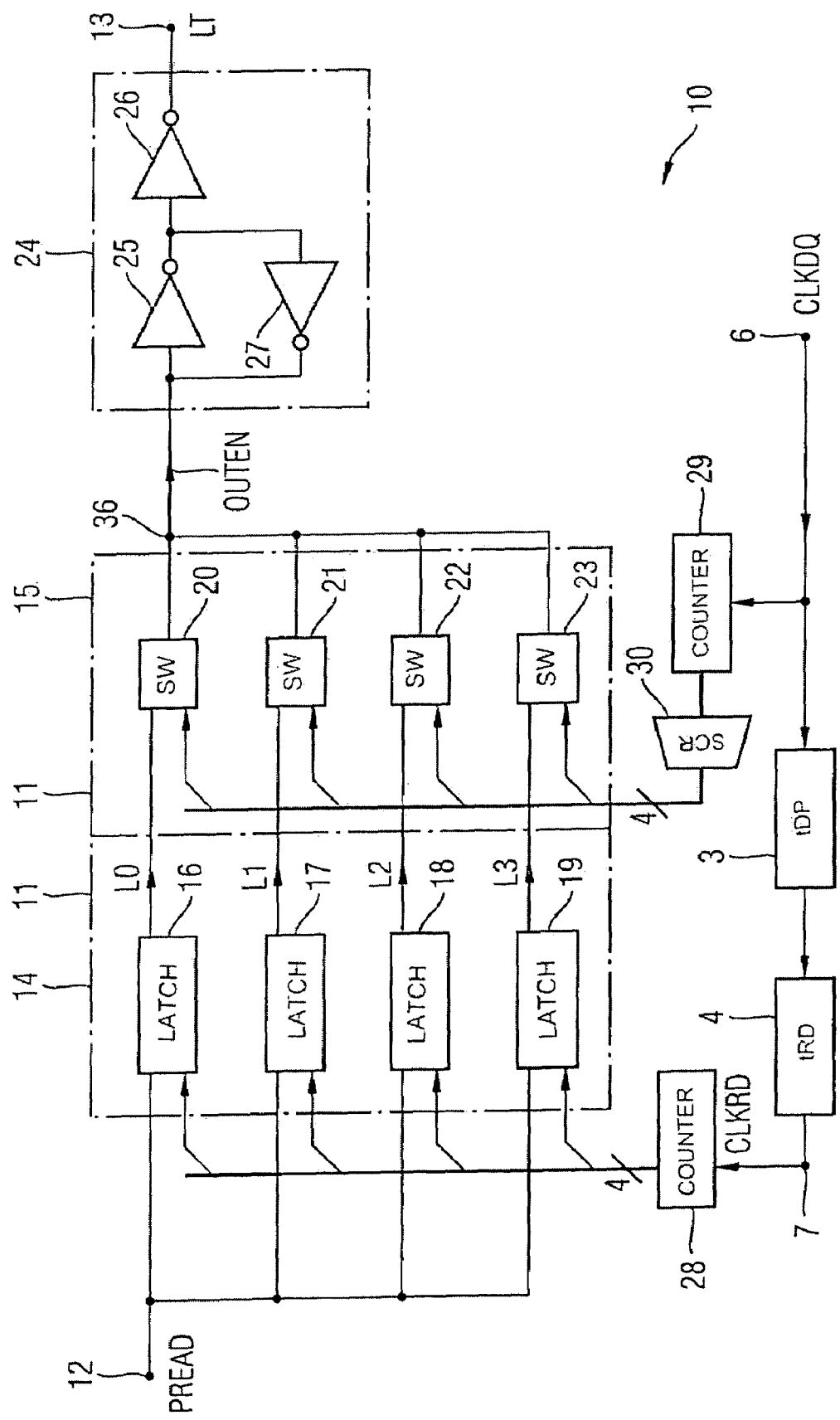

READ LATENCY CONTROL CIRCUIT

The invention relates to a method and a circuit arrangement for initializing a read latency, in particular for or in a DDR graphics memory.

Although applicable to arbitrary semiconductor memories, the present invention and also the problem area on which it is based are explained below with regard to DDR semiconductor memories and here in particular to graphics memories.

In modern computer and software applications there is increasingly a demand to process ever larger volumes of data in an ever shorter time. Large scale integrated memories, such as DRAM memories for example, are used for storing the data. Such semiconductor memories, in particular dynamic read-write memories such as a DRAM memory, are produced in different embodiments and variants, the individual embodiments essentially differing from one another by virtue of their operating behavior.

In order, then, to meet the aforementioned demand for an ever higher speed in the processing of data, it is necessary, in the case of such a semiconductor memory, for said data to be written to the memory and read from said memory again correspondingly rapidly. This can be realized for example with a further and further increasing operating frequency with which the data can be read from and written to a semiconductor memory.

A further possibility is to use semiconductor memories specially designed for high data rates. One representative of such a semiconductor memory is the so-called DDR-DRAM memory, where DDR stands for "Double Data Rate". Whereas in conventional semiconductor memories write and read operations are performed only on the rising or upon the falling edge of a clock signal, in the DDR semiconductor memories mentioned data are read from the semiconductor memory and written to the memory again both on the rising and upon the falling edge of the clock signal. These semiconductor memories are thus distinguished by a double data rate.

In a synchronous, that is to say a clock-controlled, data communication, a certain time period, the so-called latency time, typically lies between the command that initiates the data transfer and the actual data transfer. If, in a computer system comprising a processor and a memory chip, said memory chip receives from the processor a read command together with the desired address, the memory chip thereupon sends the requested data back to the processor. In this case, however, the read data are not sent to the processor immediately, but rather after a previously set, fixed number of clock cycles, the so-called read latency. A corresponding situation holds true for the write operation.

The read latency and also the write latency depends, inter alia, on the absolute time required by the memory chip to provide the data, and also on the duration of a clock cycle of the system clock. In conventional DRAM semiconductor memories, the read latency is programmed into a mode register of the semiconductor memory. In a DDR-DRAM semiconductor memory of the second generation (DDR-II), by way of example, the write latency is coupled to the read latency and is typically one clock cycle fewer than the read latency. The following thus holds true: write latency=read latency minus one.

The construction and the functioning of a latency generator and in particular of a read latency circuit are generally known, and so they will not be discussed in any greater detail below. Merely in respect of the general background of such latency circuits, reference is made to DE 102 39 322 A1, DE 102 08 715 A1, DE 102 08 716 A1 and DE 102 10 726 A1.

The publication ISSCC 2003/Session 17/SRAM and DRAM/Paper 17.8 relating to the conference "IEEE International Solid State Circuits Conference 2003" describes a read latency control circuit for SDRAM semiconductor memories. The basic principle of such a read latency control circuit is illustrated in FIG. 17.8.4 therein and consists in generating and providing two internal clock signals CLKDQ, CLKRD. These clock signals are used to drive a FIFO circuit, by which the information about a given read signal is made available to the data path of the semiconductor memory with the correct timing using a clock signal CLKDQ provided by a DLL circuit.

The known read latency control circuit thus has a FIFO circuit designed for converting two clock signals from a first time reference (time domain) for reading in data into a second time reference—different from the first—for reading out the data. The FIFO circuit is thus driven by two different clock signals that are fed to a corresponding ring counter, in each case one clock signal being used for the output pointer and a further clock signal derived therefrom being used for the input pointer of the FIFO circuit. A read command is fed to the FIFO circuit on the input side. A latency control signal can be tapped off at the output of the FIFO circuit.

Although the ISSCC 2003 publication cited in the introduction describes the use of a FIFO circuit for latency control, an initialization of the input pointer and of the output pointer and thus a synchronization of the two pointers are not described therein. However, an initialization of the FIFO circuit is essential for correct functioning of such a latency control circuit.

During the initialization, a phase relationship of the input pointers and of the output pointers has to be specified in a defined manner in order that the time between writing to a FIFO cell by means of the input pointer and reading from said cell by means of the output pointer corresponds to the desired read latency stored in the mode register.

What is problematic in the case of an inadequate initialization for input and output pointers of the FIFO circuit is that then it is not clear for the start counter for providing the input pointer when it is supposed to begin counting and what latch it is thus supposed to access. This is still not problematic, under certain circumstances, at relatively low frequencies of the semiconductor memory. However, deficient initialization, particularly at increasingly higher frequencies of the clock signal, has the consequence that, under certain circumstances, the input pointer and the output pointer of the FIFO circuit are no longer synchronized with one another, that is to say no longer have a well-defined temporal interval with respect to one another. It is necessary, however, for reliable operation of the memory.

Since the trend is toward ever higher frequencies in present-day and future semiconductor memories, such as DDR-DRAM memories of the third generation (DDR-III) for example, the abovementioned problem will consequently intensify further and further. A defined read-out of the data from the semiconductor memory is then no longer possible or possible only with a very high additional outlay on circuitry.

In this connection, reference shall also be made to the textbook by W. Dally, "Digital Systems Engineering", Cambridge 1998, pages 477-480. This also illustrates a FIFO-based latency control circuit which corresponds to the one described in the ISSCC publication and which, however, likewise does not disclose any initialization.

Against this background, the present invention is based on the objectively technical object of providing a reliable, that is to say as free of errors as possible, initialization of a read latency control circuit in particular for a semiconductor memory. In particular, the input and output pointers of a FIFO circuit of a FIFO-based read latency control circuit are intended to be brought into a well-defined temporal interval with respect to one another by means of the initialization.

According to the invention, at least one of these objects is achieved by means of a method having the features of patent claim 1 and also by means of a read latency control circuit having the features of patent claim 16.

In accordance with one preferred development, the common clock signal is a clock signal generated by a DLL circuit.

In accordance with a further preferred development, the second clock signal is derived by delay from the first clock signal.

In accordance with a further preferred development, the first clock signal corresponds to the common clock signal.

In accordance with a further preferred development, the delay is set in such a way that it corresponds to the sum of the time duration for the provision of a read signal in response to a corresponding read command for reading out the read data and the propagation time of an output driver of the semiconductor memory.

In accordance with a further preferred development, the read latency is set by means of a control signal.

In accordance with a further preferred development, the read latency set determines the start point of the output pointer and/or the start point of the input pointer.

In accordance with a further preferred development, the read latency is stored in a mode register, and a respectively stored read latency is used for defining the start interval between the input pointers and the output pointers.

In accordance with a further preferred development, the initialization of input pointers and output pointers is performed in each case when there is a restart of the DLL circuit.

In accordance with a further preferred development, at least one output of the DLL circuit is interrupted in the event of a reset. Particularly in the case of differential signals or outputs, this has the advantage that an output terminal can be put at a specific potential level, while the second signal component proceeds further, whereby a control sequence can be indicated without having to provide additional control signals.

In accordance with a further preferred development, the interruption is effected synchronously.

In accordance with a further preferred development, the number of clock cycles of the clock signal generated by the DLL circuit is counted after a reset of the DLL circuit, the initialization being initiated only after a first number of clock cycles of the clock signal, and the first number being less than a number-predetermined by the specification of the semiconductor memory—of clock cycles of said clock signal from which read accesses are permitted again after a reset.

In accordance with a further preferred development, the initialization is performed only after the DLL circuit has settled and before read accesses to the semiconductor memory can be performed.

In accordance with a further preferred development, the fixedly predetermined time offset is set by means of two ring counters that are respectively driven by one of the two clock signals.

In accordance with a further preferred development, the data width of the read signal is chosen such that the output pointer can be used for driving an output driver.

Advantageous refinements and developments of the invention emerge from the further subclaims and also the description with reference to the drawings.

The present invention proceeds from a FIFO-based read latency control circuit.

The insight underlying the present invention consists, on the one hand, in the fact that the two clock signals for the input pointer and the output pointer are in each case derived from a common clock signal as a basis. What is involved here is an internal clock signal which is generated from a DLL circuit (DLL=Delay Locked Loop) within the integrated circuit or the semiconductor memory. On the other hand, the insight consists in the fact that the one clock signal (CLKRD) for the input pointer of the FIFO and the other clock signal (CLKDQ) for the output pointer of the FIFO are different from one another. However, there is a defined time offset between these two clock signals for the input pointer and the output pointer. This offset, that is to say the corresponding time duration between the two clock signals, is specified in a defined manner and is always the same on account of the asynchronous mode of operation both at low and at high frequencies.

The method according to the invention for initializing the input pointer and output pointer of the FIFO circuit is based on an initialization sequence of the clock signals (CLKRD, CLKDQ) assigned to the input pointer and the output pointer. This initialization sequence is carried out whenever the corresponding DLL circuit for providing a basic clock signal (DLLCLK) has settled, but still before any read accesses to the semiconductor memory can be effected.

The idea of the present invention, then, consists in firstly switching off an output of a corresponding differential terminal pair of the DLL circuit. In particular, the output is switched off synchronously in this case in order to prevent shortened HIGH or LOW phases of the DLL clock signal from occurring. In the meantime, that is to say with the DLL output switched out, the DLL circuit continues to run and thus remains in the locked state, the so-called lock state. If only one of the differential outputs is decoupled or at a fixed potential and the second output further supplies the second part of the corresponding differential clock signal generated by the DLL circuit, an initialization sequence is thereby signaled. This "coding" makes it possible to save additional control lines. After a predetermined time, preferably at the end of the transient recovery phase of the DLL circuit, the invention's initialization of the clock signals for the input and output pointers of the FIFO circuit of the read latency control circuit then takes place. The initialization performed in this way ensures that the clock signals assigned to the input and output pointers have a fixed defined offset between them. It is also ensured in this way that the input and output pointers of the FIFO circuit are set anew by means of the initialization.

The particular advantage consists, then, in the fact that, at the end of this initialization, a start pointer for the start position of the input pointer and a start pointer for the start position of the output pointer are present which are set for a proper data transfer. As soon as the edges of the two clock signals, that is to say the clock signal CLKRD for the input pointer and the clock signal CLKDQ for the output pointer, appear, the two ring counters operate and start pointer and output pointer move off with a fixed interval with respect to one another. The particular advantage of the present invention consists, then, in the fact that a fixed interval between input pointer and output pointer is defined in this way.

In a particularly advantageous refinement, the initialization and thus the synchronization of input and output pointers of the FIFO circuit takes place whenever the DLL circuit is restarted. It can be ensured in this way that, with each DLL clock signal generated anew in this way, the input pointer and the output pointer for the FIFO circuit and thus also the corresponding phase relationship of the clock signals assigned to said pointers are specified in a defined manner in the case of every restart.

In a further, likewise advantageous refinement of the present invention, the data width of the read signal is chosen such that the output pointer of the FIFO circuit can be utilized directly, that is to say without any detours, for driving the output driver of the semiconductor chip.

In a likewise particularly advantageous refinement, the latency stored in a mode register, the so-called CAS latency (CAS=Column Address Select), is used for defining the start interval between input and output pointers. This may be realized for example by so-called "scrambling" or by choosing a different start value for at least one of the two ring counters of the FIFO circuit.

In a likewise particularly advantageous refinement of the invention, a counter is used which is connected to the output of the DLL circuit. Said counter then counts the number of clock cycles of the DLL clock signal generated by the DLL circuit on the output side, starting from the reset. Many semiconductor memories, as is provided in the SDRAM specification for example, prescribe a predetermined number of clock cycles before read accesses are permitted again after a reset of the DLL circuit. This is 200 clock cycles of the DLL clock signal in the case of an SDRAM specification. In the method according to the invention, said counter then triggers the initialization sequence for the corresponding input and output pointers of the FIFO circuit after a specific number of clock cycles (e.g. 180 clock cycles) that is less than the predetermined number of clock cycles (here 200 clock cycles). For this initialization, enough time then still remains, the time corresponding to 20 clock cycles in the present case, to synchronize the input pointer and the output pointer with one another.

According to the invention, the FIFO circuit has a circuit that identifies the initialization sequence and correctly sets the corresponding input and output pointers of the FIFO circuit taking account of the respectively required or desired read latency. Instead of the implementation of this circuit for identifying an initialization sequence within the FIFO circuit, it may, of course, also be coupled to the FIFO circuit.

The invention is explained in more detail below on the basis of the exemplary embodiments specified in the schematic figures of the drawings, in which:

FIG. 2 shows the basic profile of the clock signals CLKDQ, CLKRD generated by the DLL circuit during the initialization sequence according to the invention;

FIG. 3 shows a schematic block diagram for a FIFO-based read latency control circuit;

In the figures of the drawings, identical or functionally identical elements, features and signals have been provided with the same reference symbols, unless specified otherwise.

Figure 1A:
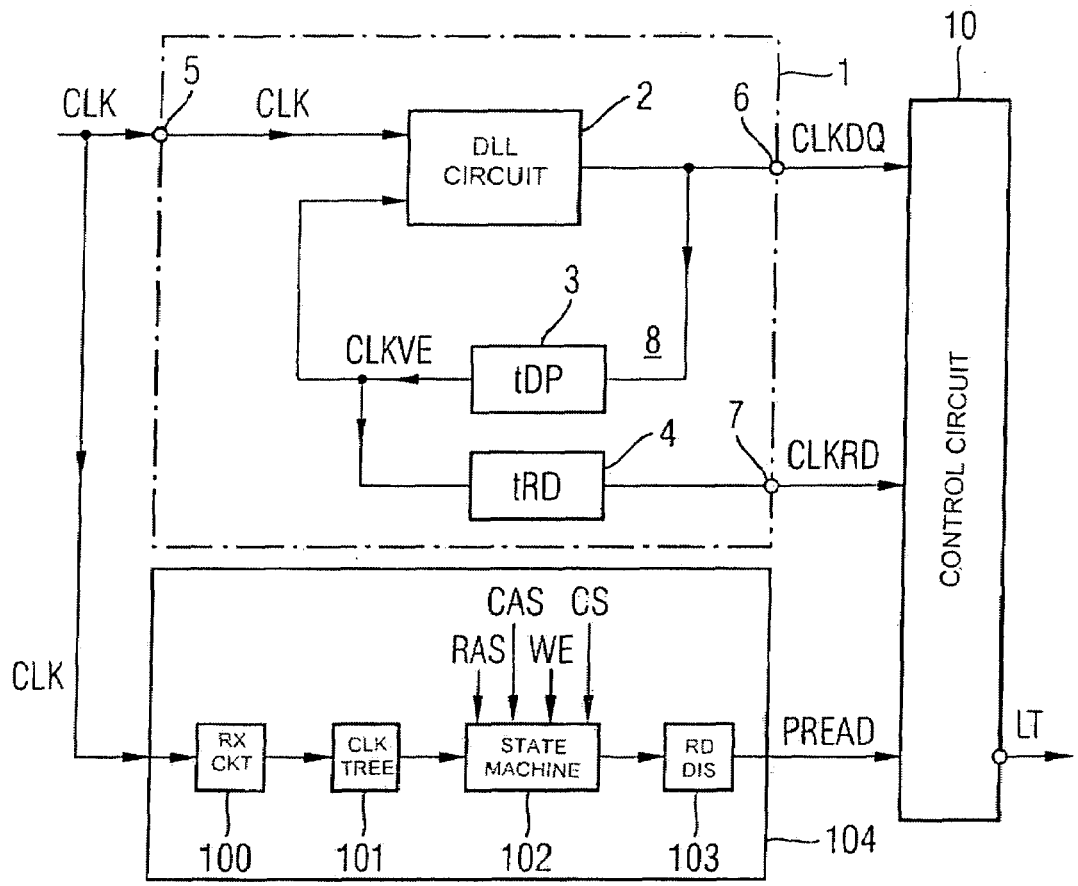
FIG. 1 shows a block diagram for a DLL circuit for generating DLL clock signals on the output side in a typical operating environment (a) and also a corresponding signal timing diagram for the clock signals correspondingly generated by the DLL circuit (b)

In FIG. 1(a), reference symbol 1 designates the DLL-based circuit arrangement for providing different clock signals. The circuit arrangement 1 has a DLL circuit 2. The DLL circuit 2 is connected to an input 5 and an output 6. An external signal CLK, for example the clock signal of the system clock, can be coupled into the DLL circuit 2 via the input 5. In the locked state, the DLL circuit 2 generates a DLL clock signal CLKDQ at the output 6. The circuit arrangement 1 furthermore has a feedback path 8, in which a delay circuit 3 designed as an OCD circuit (OCD=Off Chip Driver) is arranged. Said OCD circuit 3 generates from the DLL clock signal CLKDQ, on the output side, a delayed clock signal CLKVE derived therefrom, which is fed to a further input of the DLL circuit 2. Said clock signal CLKVE is furthermore fed to a further delay circuit 4 connected to a further clock output 7. The delay circuit 4 thus generates the clock signal CLKRD on the output side. These clock signals CLKDQ and CLKRD are typically fed to a read latency control circuit 10 according to the invention, as will be explained in more detail in the following figures. The read latency control circuit 10 receives a read signal PREAD and outputs a latency control signal LT. The read signal PREAD is generated by a sequence controller 104 clocked by the external clock signal CLK. The generated read signal PREAD is delayed with respect to the clock signal CLK since the external clock signal CLK passes through a receiver circuit 100 in the sequence controller 104 and is subjected to wiring propagation times of a clock branching tree 101 and of a read signal distributor 103 and the state machine 102, which receives the relevant control signals RAS, CAS, WE, CS, inter alia, causes a certain signal delay. The read signal PREAD supplied by the sequence controller 104 is offset by a time tRD in comparison with the external clock signal CLK.

The delay circuits 3, 4 are designed as so-called replica circuits, the replica circuit 4 serving for the simulation of the signal path in the sequence controller 104 and thus the delay of the time duration tRD. A read command RD signaled by control signals to the sequence controller 104 is applied with the external clock signal CLK, whereupon the read signal PREAD is ready after the time tRD. The delay tRD thus corresponds to the period of time between the application of a read command RD and the provision of the read signal PREAD by the sequence controller 104.

The replica circuit 3 simulates the circuit arrangement of an offset driver and thus effects delay by the propagation time of said offset driver tDP.

Figure 1B:
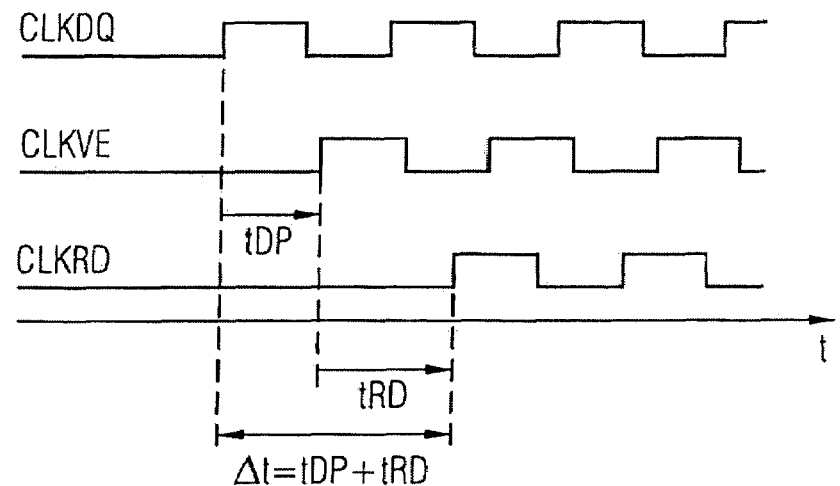

FIG. 1(b) shows the corresponding signal timing diagrams of the clock signals CLKDQ, CLKVE, CLKRD generated by the circuit arrangement 1 or the DLL circuit 2 on the output side. The clock signal CLKVE has a delay of tDP relative to the clock signal CLKDQ by virtue of the replica circuit 3. The clock signal CLKRD has a delay tRD relative to the clock signal CLKVE. Consequently, a time offset of Δt=tDP+tRD results overall for the clock signals CLKDQ, CLKRD provided at the outputs 6, 7.

FIG. 2 shows the basic profile of the clock signals CLKDQ, CLKRD generated by the DLL circuit during the initialization sequence according to the invention.

In this case, the instant at which the output of the DLL circuit 2 and thus the clock signal CLKDQ are switched off is designated by t1 in FIG. 2. The corresponding instant for the clock signal CLKRD is designated by t1'. After a number of, for example 20, clock cycles (t=20*tCK), at the instant t2, the DLL circuit 2 is switched in again and again provides the full clock signal CLKDQ on the output side. The corresponding instant—delayed by the duration Δt—for the clock signal CLKRD is designated by t2'.

The two clock signals CLKDQ, CLKRD are used for the synchronization of the respective input and output pointers of the FIFO circuit of a read latency control circuit. The construction and the functioning of this read latency control circuit or of the corresponding latency FIFO will be described in detail below with reference to FIGS. 3, 4, 6. By means of the circuit arrangement 1, the output clock signal CLKDQ is thus passed via a simulation of the relevant parts of the data path and the relevant parts of the generation or distribution of the internal read signal, the so-called PREAD signal, in order to generate the clock signal CLKRD therefrom. The method according to the invention for initializing the input and output pointers of the latency FIFO is based, then, on an initialization sequence according to the invention of these two clock signals CLKDQ, CLKRD. This initialization sequence is carried out after the DLL circuit 2 has settled, that is to say locked, but still before any read accesses to the semiconductor memory can be effected.

In a preferred exemplary embodiment of the invention, the DLL circuit is used in conjunction with a counter that counts the number of clock cycles after a reset of the DLL circuit 2. After a predetermined number of clock cycles in the transient recovery phase of the DLL circuit, said counter triggers the initialization sequence according to the invention for the latency FIFO. Said initialization sequence consists for example in the fact that firstly the output of the DLL circuit 2 and thus the clock signal CLKDQ are switched off synchronously. The DLL circuit 2 continues to run in the meantime since only the output has been switched out, but the DLL circuit is still in the locked state. After a predetermined number of clock cycles, the DLL circuit 2 is switched on synchronously again, as a result of which the clock signal CLKDQ is present at the output of the DLL circuit 2. After a delay time of Δt=tDP+tRD, the clock signal CLKRD is then also present at the output 7.

FIG. 3 shows the schematic construction of a FIFO-based read latency control circuit on the basis of a block diagram. The circuit arrangement described in FIG. 3 builds on the circuit topology of the ISSCC publication cited in the introduction, and of the circuit arrangement described in FIG. 17.8.4 therein.

The read latency control circuit is designated by reference symbol 10 in FIG. 3. The read latency control circuit 10 has a latency FIFO 11 arranged between an input 12 and an output 13. In this case, a read signal PREAD is present at the input 12 and a latency control signal LT can be tapped off at the output 13. The latency FIFO 11 has a latch device 14 and also a switch device 15. In the present exemplary embodiment, the latch device 14 contains four latches 16-19 arranged in parallel with one another. A data signal L0-L3 can respectively be tapped off at the outputs of a respective latch 16-19. The switch device 15 is connected downstream of the latch device 14 and contains in the same way four switches 20-23, for example multiplexers, arranged in parallel with one another. In this case, a respective latch 16-19 is connected, on the input side, to the input 12 of the read latency control circuit 10 and, on the output side, in each case to one of the switches 20-23 connected downstream in series. The switches 20-23 are connected to the output 13 on the output side. The latency FIFO 11 thus has four FIFO cells.

An inverter arrangement 24 is furthermore provided between the switch device 15 and the output 13. The inverter arrangement 24 has in each case two inverters 25, 26 arranged in series with one another, a feedback inverter 27 being reverse-connected in parallel with one inverter.

The circuit arrangement 10 furthermore has two counters 28, 29, which are preferably designed as ring counters 28, 29. The counter 28 is connected to the terminal 7 on the input side, so that the clock signal CLKRD is fed to said counter 28. The counter 28 is connected on the output side in each case to control terminals of the individual latches 16-19. The counter 28 thus generates on the output side four different input pointers for the four different latches 16-19, as will be illustrated below with reference to FIG. 4.

The ring counter 29 is connected, on the input side, to the terminal 6 with the clock signal CLKDQ. On the output side, the counter 29 is connected to a switch 20-23 in each case. Furthermore, a so-called scrambler 30, that is to say a mixing circuit 30, is interposed between the counter 29 and the switch device 15. The scrambler 30 generates, on the output side, four output pointers that are fed to the four different switches 20-23. The precise construction and the functioning of such a scrambler 30 are generally known, and so they will not be discussed in any greater detail below.

An initialization identification circuit (not illustrated in FIG. 3) is provided at the latency FIFO 11, which circuit identifies an initialization sequence, as illustrated in FIG. 2, and then correctly sets the output pointers of the latency FIFO 11 taking account of the required read latency.

Figure 4:
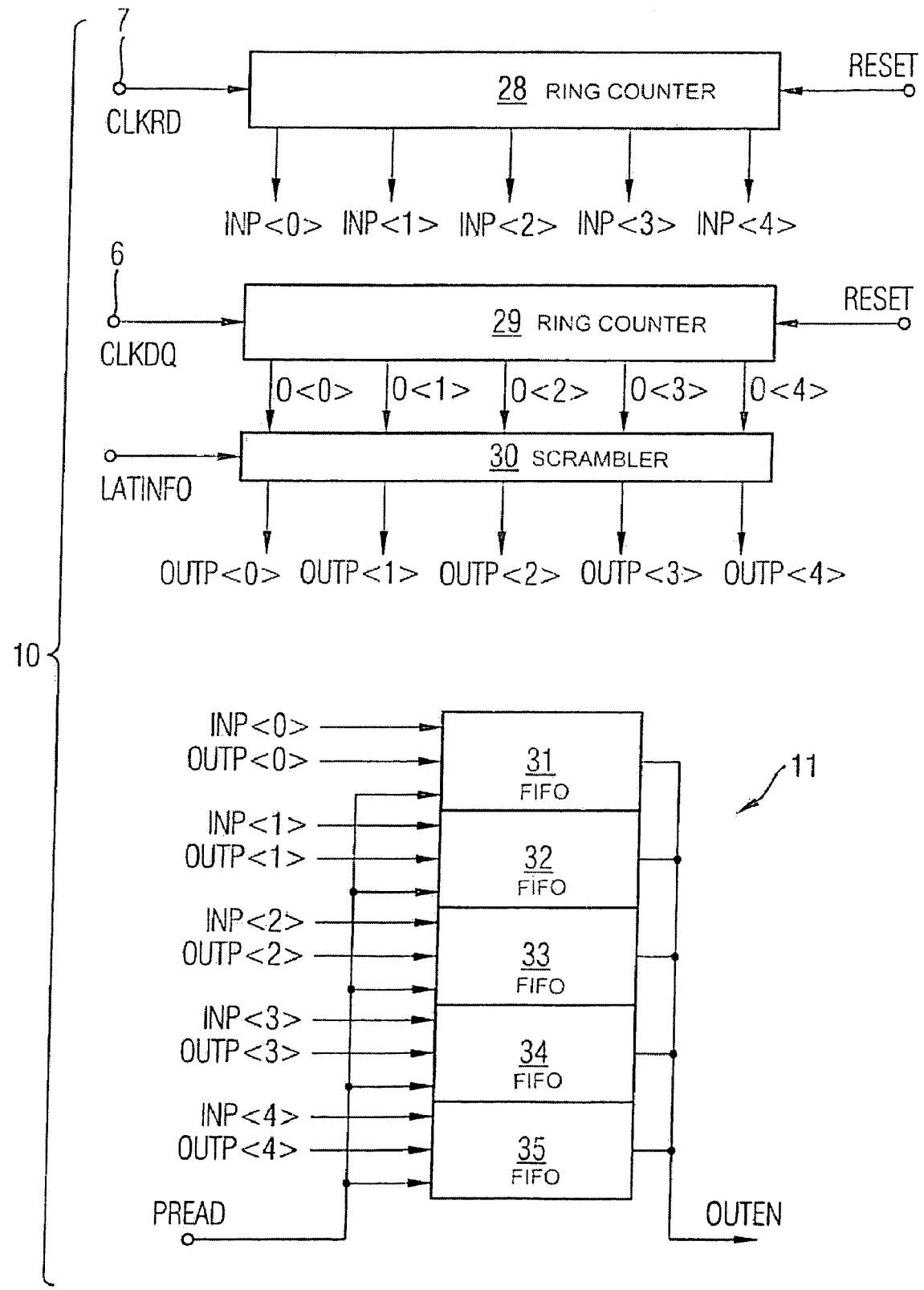
FIG. 4 shows the construction and the functioning of the read latency control circuit corresponding to FIG. 3 on the basis of a detailed function circuit diagram.

FIG. 4 shows the construction and the functioning of the read latency control circuit corresponding to FIG. 3 on the basis of a detailed function circuit diagram.

In contrast to the exemplary embodiment in FIG. 3, in which the read latency control circuit is equipped with a latency FIFO 11 with four FIFO cells and thus has a FIFO depth of four, the latency FIFO 11 in FIG. 4 has a FIFO depth of five. It shall furthermore be assumed that the read latency control circuit 10 in FIG. 4 is designed for a latency of L=5.

The ring counter 28 generates five input pointers INP<0>-INP<4> on the output side. The ring counter 29 generates five output signals O<0>-O<4> on the output side, which are coupled into inputs of the scrambler 30 connected downstream. The two ring counters 28, 29 can be reset by means of a reset signal RESET.

On the control side, the scrambler 30 is fed a control signal LATINFO, by means of which a latency value stored in a mode register, for example, is coupled into the scrambler 30 on the control side. The scrambler 30 serves the purpose of setting different latencies. The scrambler 30 generates five different output pointers OUTP<0>-OUTP<4> on the output side.

The input and output pointers INP<0>-INP<4>, OUTP<0>-OUTP<4> generated by means of the ring counters 28, 29 and also the scrambler 30 are coupled into corresponding control inputs of the latency FIFO 11. Said latency FIFO 11 has a total of five FIFO cells 31-35 which may in each case have a latch and a switch connected downstream of said latch (see FIG. 3). Moreover, the internal read input signal PREAD is fed to the various FIFO cells 31-35. Depending on said read input signal PREAD and also the respective input pointers INP<0>-INP<4> and output pointers OUTP<0>-OUTP<4>, the latency FIFO 11 generates an output signal OUTEN at the output.

Figure 5:
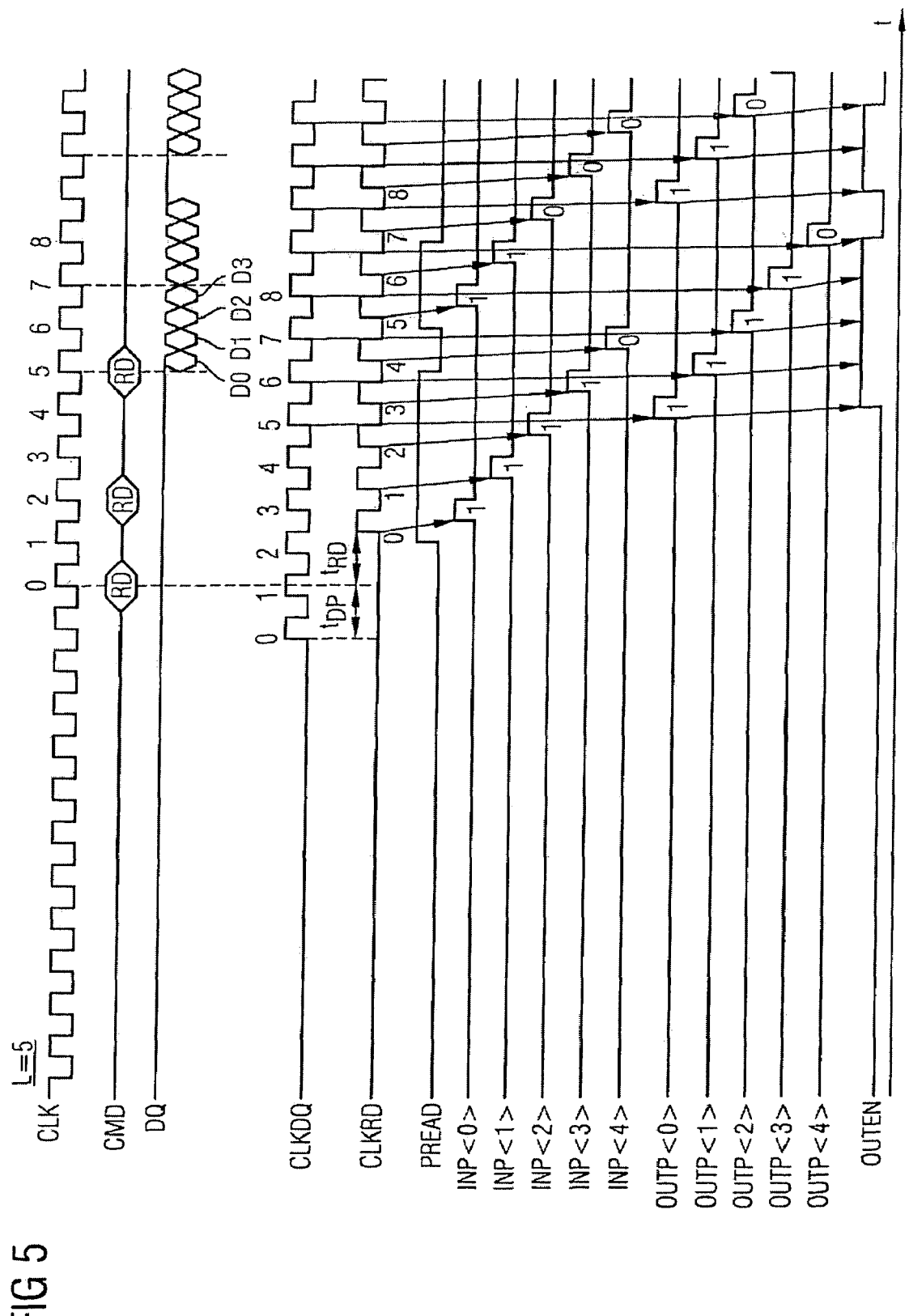
FIG. 5 shows a signal timing diagram for the signals present at the FIFO circuit of the function circuit diagram in FIG. 4.

FIG. 5 shows the corresponding sequence diagram for the function circuit diagram corresponding to FIG. 4. In this case, the signal CLK designates the external clock signal, for example the clock signal of the system clock. The signal CMD designates the command signal, that is to say a read command RD for example. The signal DQ designates the external data signal that is intended to be read from the semiconductor memory for example.

The initialization sequence according to the invention will be explained briefly below with reference to FIGS. 5 and 2:

The clock signal CLKRD is constructed with the corresponding delay Δt=tRD+tDP from the clock signal CLKDQ using the replica circuits 3, 4. At the start of the initialization phase for the synchronization, both clock signals CLKDQ, CLKRD are switched to a low logic level ("0", LOW) for a predetermined time duration, for approximately 20 clock cycles in the case of the exemplary embodiment of FIG. 2. As soon as this so-called LOW phase of the two clock signals CLKDQ, CLKRD is identified by a detector circuit provided for this at the beginning, the respective output pointers OUTP<0>-OUTP<4> are set to an initial state in accordance with the desired latency. A latency of L=5 is provided for the exemplary embodiment illustrated in FIGS. 4 and 5. In this case, the output pointer OUTP<4> has to be chosen as the start point. With the edge "5" of the clock signal CLKDQ, the output pointer is accordingly switched from OUTP<4> to OUTP<0>. The FIFO cell 31 which is opened by said output pointer OUTP<0> then contains the items of information regarding whether or not a read command RD was accepted with the edge "0" of the clock signal CLKRD.

FIG. 5 represents three read commands for illustration purposes. In the case of the input pointers INP<0>-INP<4>, the depicted "0" or the depicted "1" illustrates whether the internally generated read signal PREAD is identified as "1" or as "0". This internal read signal PREAD thus provides an item of information regarding the presence of a read command RD, a read command RD having been identified in the case of a high logic level or a "1" of the PREAD signal and no read command being present in the case of a low logic level or a "0" of the PREAD signal.

The output signal OUTEN at the output 36 of the latency FIFO 11 contains the items of information to the effect of the instants at which the output drivers of the semiconductor memory will receive the enable signal for reading the data. In the present exemplary embodiment, the read signal PREAD has an overall length of two clock cycles, thereby satisfying the need to provide, per read access, four data in each case having the data width of half a clock cycle externally toward the outside. This read operation is generally also referred to as prefetch-4 access. Through the choice of the data width of the PREAD signal in accordance with the width of the prefetch access used, the output of the latency FIFO 11 can very advantageously directly be utilized for driving the output driver for the semiconductor memory. This advantageous configuration of the invention shall be illustrated below with reference to Table 1, which reproduces the relationship of the width of the PREAD signal and a prefetch access:

TABLE 1

| Prefetch | Width of the PREAD signal |
|---|---|
| 2 | 1 |
| 4 | 2 |
| 8 | 4 |

The scrambler 30 evaluates, at the instant of initialization, the read latency which is stored in the mode register (not illustrated) and is fed to the scrambler 30 in the form of the latency control signal LATINFO. In a very advantageous configuration, the read latency control circuit 10 according to the invention has an adjustable read latency L. By way of example, it is possible here to set read latencies of 5, 6 and 7, depending on the value of the latency control signal LATINFO. Table 2 below illustrates the relationship of the respective start point of the output pointer OUTP<0>-OUTP<4> for the read latencies 5, 6, 7.

TABLE 2

| Read latency L | Start point for output pointers |
|---|---|
| 5 | OUTP<4> |
| 6 | OUTP<3> |
| 7 | OUTP<2> |

Table 2 above applies only to a latency FIFO having a depth of 5, that is to say a latency FIFO such as is illustrated in FIG. 4. The depth of the latency FIFO 11 depends on the highest latency that can be chosen and on the delay times tDP, tRD. In this case, the delay time tDP essentially corresponds to the lead time of the DLL circuit. The time tRD designates the time between the acceptance of an external read signal and the presence of the signal PREAD at the latency FIFO.

Figure 6:
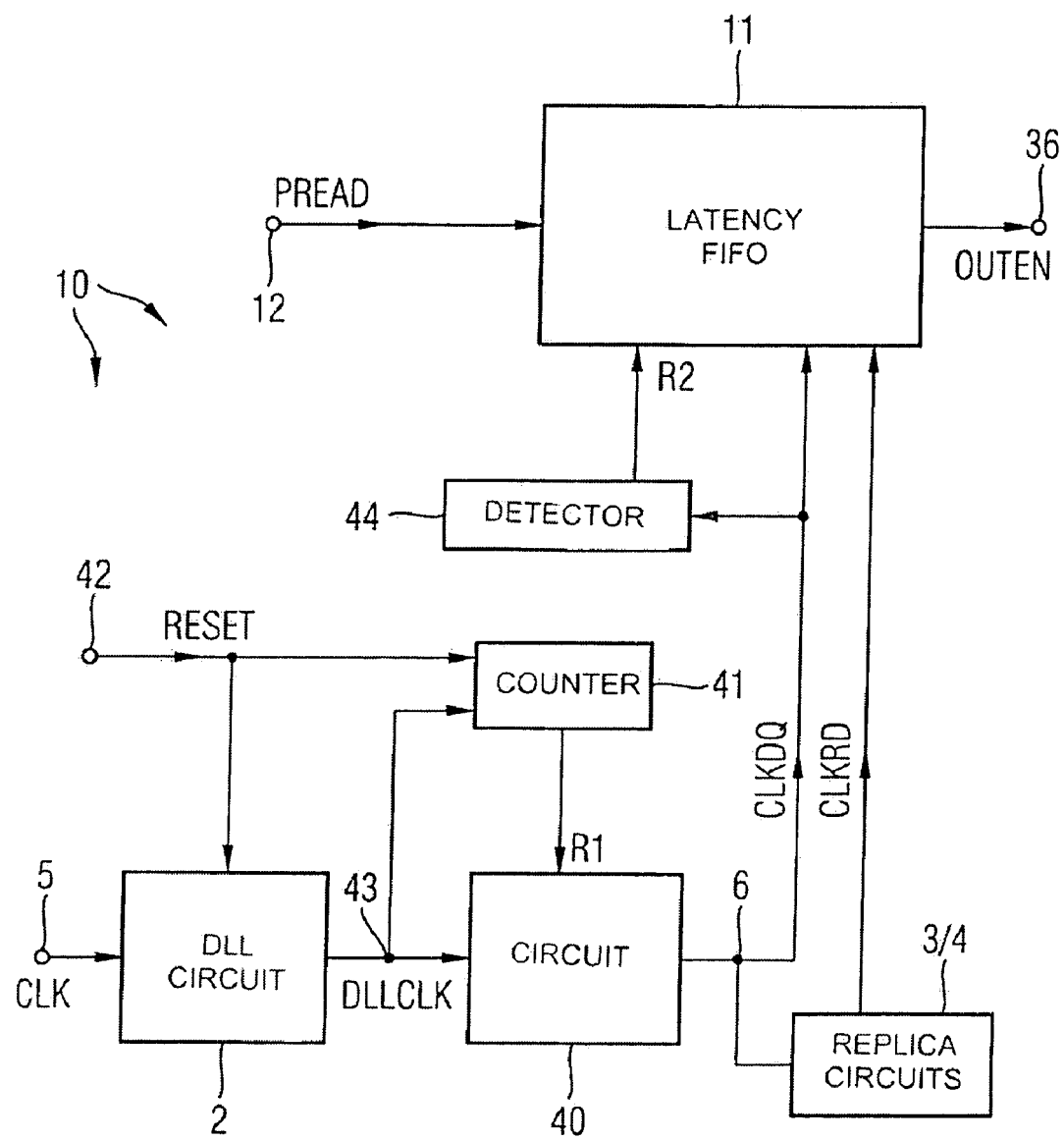
FIG. 6 shows a block diagram of a read latency control circuit according to the invention with a latency FIFO.

FIG. 6 shows a block diagram of a read latency control circuit according to the invention.

The read latency control circuit according to the invention in accordance with FIG. 6 first of all has a device for switching off the output of the DLL circuit 2. Furthermore, the read latency control circuit 10 also contains a circuit that identifies the initialization sequence and correctly sets the output pointers of the latency FIFO 11 taking account of the required read latency. In this case, the circuit topology in the exemplary embodiment of FIG. 6 builds on the DLL circuit 2 in FIG. 1 and also the circuit arrangements in FIGS. 3 and 4.

A circuit 40 is provided between the output 6 and the output of the DLL circuit 2, which circuit 40 makes it possible to perform a synchronous switch-off of the DLL clock signal DLLCLK provided by the DLL circuit 2 on the output side. This circuit arrangement 40 is driven by means of a switch-off control signal R1. Said switch-off control signal R1 is provided by a counter 41. The counter 41 is connected, on the input side, to a reset input 42 and also to the differential output terminal pair 43 of the DLL circuit 2. A reset signal RESET can be coupled in via the reset input 42. Said reset signal RESET is coupled into the DLL circuit 2, on the one hand, and into the counter 41, on the other hand. The counter 41 is furthermore fed the output signal DLLCLK of the DLL circuit 2. The counter 41 generates the switch-off control signal R1 from these two signals, said switch-off control signal being fed to the circuit arrangement 40 for the purpose of switching off the latter.

A detector device 44 is furthermore provided. The detector device 44 is designed to generate a reset signal R2, by means of which the latency FIFO 11 can be reset. For this purpose, the detector circuit 44 is connected to the output 6 on the input side and to a control input of the latency FIFO 11 on the output side. The detector circuit 44 is thus fed the clock signal CLKDQ on the input side.

In FIG. 6, in contrast to FIG. 3, the two replica circuits 3, 4 are implemented in a single circuit block.

The functioning of the read latency control circuit 10 according to the invention in accordance with FIG. 6 shall be illustrated briefly below.

The output signal DLLCLK of the DLL circuit 2 is coupled into the counter 41. After an externally predetermined DLL reset, the corresponding reset signal RESET is likewise coupled into the counter 41.

In an alternative embodiment, it is possible to dispense with a control line between the reset input 42 and the counter

41 by communicating a reset by passing only one of the differential partial signals DLLCLK to the counter, while the second is used as control or reset signal.

After said reset signal RESET has been coupled in, the counter 41 counts the clock cycles of the clock signal DLLCLK up to a predetermined number of 180, for example. The DLL circuit 2 is subsequently in the settled state. A time of approximately 20 clock cycles then still remains for performing the latency FIFO initialization according to the invention. Given the presence of the switch-off control signal R1, which corresponds to the counter value 180, the circuit arrangement 40 for synchronous switch-off interrupts the output 43 of the DLL circuit 2, so that no clock signal CLKDQ is coupled into the latency FIFO 11 via the output 6. As a consequence, the clock signal CLKRD is thus interrupted as well. The particular advantage of the functionality of this switch-off device 40 in conjunction with the counter 41 consists in the fact that the clock signal CLKDQ is interrupted for a few clock cycles without half clock cycles or partial clock cycles of the clock signal CLKDQ being able to arise.

The detector circuit 44 discovers the absence of a plurality of HIGH phases of the clock signal CLKDQ and generates at the output the reset signal R2 for driving the latency FIFO 11. The construction and the functioning of the detector circuit 44 and also of the counter 41 connected to the output 43 of the DLL circuit 2 are generally known, and so they will not be discussed in any greater detail below.

Figure 7:
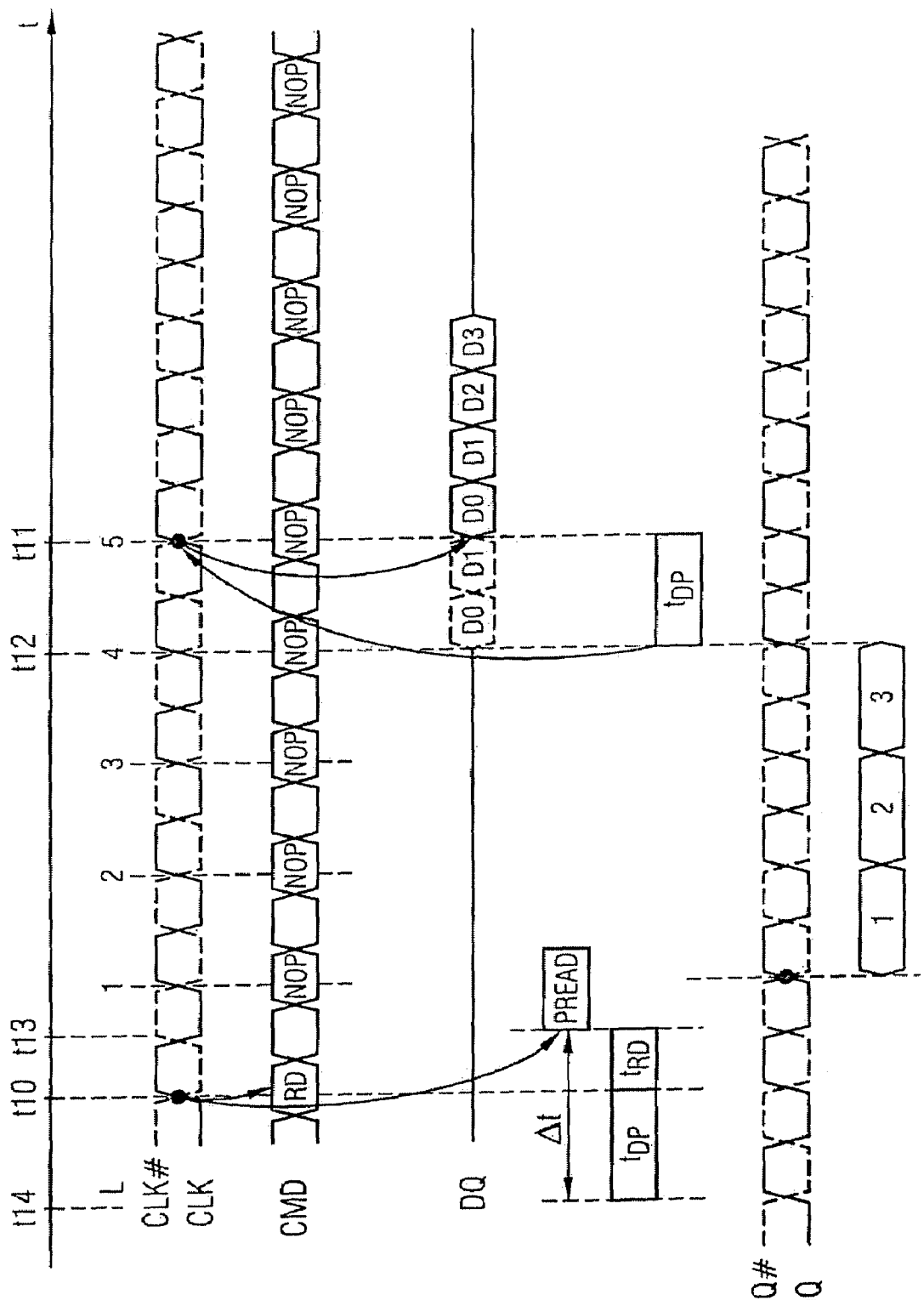
FIG. 7 shows a signal timing diagram for an initialization for the corresponding input and output pointers of the latency FIFO.

FIG. 7 uses a sequence diagram to show the method according to the invention for the initialization and thus for the synchronization of the output and input pointers of a latency FIFO 11. In this method, both the delay time tDP, which is a function of the propagation time of the offset driver of the semiconductor circuit, and the delay tRD, which designates the time for providing the read signal PREAD for read-out of the data, are taken into consideration for the initialization.

FIG. 7 illustrates an exemplary embodiment with a latency L=5. A read command RD is issued at the instant t10. In order that the read data D0-D3 that are read out taking account of the latency L=5 are also read out synchronously, the corresponding delay times tRD, tDP have to be taken into account. Synchronous read-out is to be understood to mean that the read data D0-D4 are synchronous with regard to the externally provided clock signal CLK or a clock signal derived therefrom, for example the inverted clock signal CLK#.

In the example in FIG. 7, the first datum D0 of the read data D0-D4 is intended to be read out, thus beginning with the instant t11. In this case, the instant t11 corresponds to the rising edge of the external clock signal CLK or the corresponding falling edge of the inverted clock signal CLK#. The read-out operation or the control of this read-out operation and in particular the setting of the desired latency of L=4 are not effected on the basis of said external clock signal CLK, however. An internal clock signal DLLCLK, CLKDQ which is used for setting the read latency is used for this. This internal clock signal DLLCLK, CLKDQ is derived by a DLL circuit 2. What is problematic about this is that the delay times tRD and tDP have to be taken into account here, however. This means that, on the one hand, for a synchronous read-out of the data D0-D4 after the latency L=5, the corresponding output pointer for the read-out of the data has to concomitantly take account of the delay tDP, that is to say the propagation-time-dictated duration of the offset drivers. In this respect, the corresponding rising edge of the clock signal CLKDQ which is used to signal that the data D0-D4 are to be read out synchronously with the clock signal CLK has to be brought forward temporally by the delay time tDP in order to synchronously initiate this read-out operation. The output pointer for the clock signal CLKDQ must therefore point to the instant t12. The instant t12 temporally precedes the instant t11 in such a way that the difference between t11 and t12 corresponds to the delay time tDP.

Moreover, the time tRD also has to be taken into account for a synchronous read-out. After this instant tRD relative to the instant t10, the internal read signal PREAD is output, which requests a read operation. This read signal PREAD is requested externally by means of the read command RD.

In order that the data can be read out synchronously relative to the external clock signal CLK, the internal clock signal CLKDQ provided by the DLL circuit 2 has to be set correspondingly taking account of the time durations Δt=tDP+tRD. Since the delay time tRD is fixedly predetermined relative to the instant t10, it is necessary, in order to determine the instant t14 at which the internal clock signal CLKDQ has its rising edge, to subtract the delay tDP from the instant t10, so that the difference between the instants t13 and t14 precisely corresponds to the time duration Δt=tDP and tRD. The internal clock signal CLKDQ thus has its rising edge at the instant t14, thereby ensuring that, at the instant t11, the data can be read out synchronously taking account of the latency L=5.

Although the present invention has been explained in more detail above on the basis of a preferred exemplary embodiment, it shall not be restricted thereto, but rather can be modified in diverse ways.

In particular, the read latency control circuits according to the invention and also the corresponding FIFO, the ring counters and the scrambler have deliberately been illustrated in a very simple manner. It goes without saying that this circuit topography described can be modified arbitrarily without departing from the fundamental principle of the present invention. Thus, in the exemplary embodiments above, the scrambler was assigned to the ring counter for providing the various output pointers. However, the scrambler may additionally or alternatively also be assigned to the ring counter for providing the input pointers.

It holds true, in principle, that the functionality of these read latency control circuits may, of course, also be realized by a program-controlled device, for example by a microprocessor or a microcontroller, or else by a programmable logic circuit, for example a PLD or FPGA circuit. However, the configuration described with reference to the figures above is particularly advantageous, and therefore preferable, in particular for circuitry reasons and for reasons of performance.

Moreover, a so-called prefetch-4 read access, in which four data packets are respectively written to the memory during each read access, need not necessarily be provided. Other prefetch read accesses in which fewer or else more data packets are processed per write access would also be conceivable, for example a prefetch-2 or a prefetch-8 read access.

In the exemplary embodiments above, the read latency control circuit was illustrated for a latency FIFO having a depth of 4 or 5. An arbitrarily different configuration of the Latency FIFO 11 with a greater or lesser depth would be conceivable here, of course. Moreover, unlike in the exemplary embodiment of FIGS. 5 and 7, the read latency is not restricted to read latencies of 5. Larger or small read latencies can also be provided here, of course. This merely requires a circuitry variation of the corresponding FIFO cells or of the latency FIFO.

Although single signals or signal paths are depicted merely schematically in the figures, the latency control according to the invention likewise encompasses the setting and generation of differential signals. Correspondingly, the terminals and signal paths illustrated are also to be understood as differential terminal pairs and signal paths.

| List of reference symbols | |
|---|---|
| 1 | Circuit arrangement |
| 2 | DLL circuit |
| 3 | Replica circuit, delay circuit for tDP |
| 4 | Replica circuit, delay circuit for tRD |
| 5 | Input |
| 6 | Output |
| 7 | Output |
| 8 | Feedback path |
| 10 | Read latency control circuit |
| 11 | Latency FIFO |
| 12 | Input |
| 13 | Output |
| 14 | Latch device |
| 15 | Switch device |
| 16-19 | Latches |
| 20-23 | Switches, multiplexers |
| 24 | Inverter circuit |
| 25, 26 | Inverters |
| 27 | Feedback inverter |
| 28 | Ring counter for input pointers |
| 29 | Ring counter for output pointers |
| 30 | Scrambler, mixing circuit |
| 31-35 | FIFO cells |
| 36 | Output of the latency FIFO |
| 40 | Circuit for synchronous switch-off |
| 41 | Counter |
| 42 | Reset input |
| 43 | Output of the DLL circuit |
| 44 | Detector circuit |
| 100 | Receiving circuit |
| 101 | Clock branching tree |
| 102 | State machine |
| 103 | Read signal distributor |
| 104 | Sequence controller |
| CLK# | Inverse external clock signal |
| CLK | External clock signal |
| CLKDQ | Internal clock signal |
| CLKRD | Delayed internal clock signal |
| CLKVE | Delayed internal clock signal |
| DLLCLK | Clock signal at the output of the DLL circuit |
| INP<0> ... <4> | Input pointers |
| L | Latency |
| L0-L3 | Data signals |
| LATINFO | Latency control signal |
| LT | Latency control signal |
| O<0>-O<4> | Output signal |
| OUTEN | Output signal |
| OUTP<0> ... <4> | Output pointers |
| PREAD | Read signal |
| R1 | Switch-off control signal |
| R2 | Reset signal |
| RESET | Reset signal |
| Δt | Delay duration, time offset |
| t1, t1' | First instant |
| t2, t2' | Second instant |
| t10-t14 | Instants |
| tDP | First delay |
| tRD | Second delay |
| tCLK | Clock duration |
| t | Time |
| D0-D3 | Data |
| DQ | Data signals |
| CMD | Command signals |
| RD | Read command |
| RAS | Control signal |
| CAS | Control signal |
| WE | Control signal |
| CS | Control signal |

The invention claimed is:

1. A method for setting and controlling a read latency by means of a FIFO-based read latency control circuit for a read access to a semiconductor memory, having the method steps of:
providing a common internal clock signal;
generating an internal first clock signal and an internal second clock signal, which is different from the first clock signal, from the common clock signal;
generating an output pointer for reading out the read data from the first clock signal;
generating an input pointer for reading in the read data from the second clock signal;
initializing the input and output pointers by allocating a defined, fixedly predetermined time offset between output pointer and input pointer.

2. The method as claimed in claim 1, wherein the common clock signal is a clock signal generated by a DLL circuit.

3. The method as claimed in claim 1, wherein the second clock signal is derived by delay from the first clock signal.

4. The method as claimed in claim 1, wherein the first clock signal corresponds to the common clock signal.

5. The method as claimed in claim 1, wherein the delay is set in such a way that it corresponds to the sum of the time duration for the provision of a read signal in response to a corresponding read command for reading out the read data and the propagation time of an output driver of the semiconductor memory.

6. The method as claimed in claim 1, wherein the read latency is set by means of a control signal.

7. The method as claimed in claim 1, wherein the read latency set determines the start point of the output pointer and/or the start point of the input pointer.

8. The method as claimed in claim 1, wherein the read latency is stored in a mode register, and a respectively stored read latency is used for defining the start interval between the input pointers and the output pointers.

9. The method as claimed in claim 1, wherein the initialization of input pointers and output pointers is performed in each case when there is a restart of the DLL circuit.

10. The method as claimed in claim 1, wherein at least one output of the DLL circuit is interrupted in the event of a reset.

11. The method as claimed in claim 10, wherein the interruption is effected synchronously.

12. The method as claimed in claim 1, wherein the number of clock cycles of the clock signal generated by the DLL circuit is counted after a reset of the DLL circuit, the initialization being initiated only after a first number of clock cycles of the clock signal, and the first number being less than a number—predetermined by the specification of the semiconductor memory—of clock cycles of said clock signal from which read accesses are permitted again after a reset.

13. The method as claimed in claim 1, wherein the initialization is performed only after the DLL circuit has settled and before read accesses to the semiconductor memory can be performed.

14. The method as claimed in claim 1, wherein the fixedly predetermined time offset is set by means of two ring counters that are respectively driven by one of the two clock signals.

15. The method as claimed in claim 1, wherein the data width of the read signal is chosen such that the output pointer can be used for driving an output driver.

16. A read latency control circuit for setting and controlling a read latency for a read access to a semiconductor memory, in particular for implementing a method as claimed in claim 1, having a latency FIFO arranged between an input, to which an internal read signal can be applied, and an output, having a clock input, to which an internal first DLL clock signal can be applied, having at least one first counter for providing at least one output pointer, which is connected to the clock input on the input side, having at least one delay circuit, which generates an internal second DLL clock signal by delay of the first DLL clock signal, having at least one second counter for providing at least one input pointer, which is connected to the clock input via the delay circuit on the input side, having an initialization circuit, which performs a synchronization of the first and second internal DLL clock signals.

17. The read latency control circuit as claimed in claim 16, wherein at least one latency setting device is provided, it being possible for the latency to be set by means of a latency control signal.

18. The read latency control circuit as claimed in claim 17, wherein the latency setting device is arranged between the first and/or the second counter and control terminals of the latency FIFO.

19. The read latency control circuit as claimed in claim 16, wherein the at least one of the counters is designed as a ring counter.

20. The read latency control circuit as claimed in claim 16, wherein the initialization circuit has a circuit for synchronously switching off the clock signal generated by a DLL circuit.

21. The read latency control circuit as claimed in claim 16, wherein the initialization circuit is arranged in a manner connected downstream of a clock output of a DLL circuit.

22. The read latency control circuit as claimed in claim 21, wherein a further counter is provided, which, on the input side, is connected to a reset input and also to the clock output and which, on the output side, drives a control input of the circuit for synchronous switch-off, the further counter, given the presence of a reset signal, counting the clock cycles of the clock signal and, upon a predetermined counter reading, outputting a control signal for interrupting the clock signal to the circuit for synchronous interruption.

23. The read latency control circuit as claimed in claim 16, wherein a detector circuit is provided, which is arranged in a manner connected downstream of the circuit for synchronous switch-off and which generates a further reset signal, which can be fed to a control input of the latency FIFO and by means of which the latency FIFO can be reset.

24. A semiconductor memory having a read latency control circuit as claimed in claim 16.

25. The semiconductor memory as claimed in claim 24, wherein the semiconductor memory is a DDR memory, in particular of the $2^{nd}$ and/or $3^{rd}$ generation.

* * * * *